US012690257B2

(12) United States Patent
Yemenicioglu et al.

(10) Patent No.: US 12,690,257 B2
(45) Date of Patent: Jul. 21, 2026

(54) STACKED SOURCE OR DRAIN CONTACT FLYOVER

(71) Applicant: Intel Corporation, Santa Clara, CA (US)

(72) Inventors: Sukru Yemenicioglu, Portand, OR (US); Quan Shi, Portland, OR (US); Marni Nabors, Portland, OR (US); Charles H. Wallace, Portland, OR (US); Xinning Wang, Hillsboro, OR (US); Tahir Ghani, Portland, OR (US); Andy Chih-Hung Wei, Yamhill, OR (US); Mohit K. Haran, Forest Grove, OR (US); Leonard P. Guler, Hillsboro, OR (US); Sivakumar Venkataraman, Hillsboro, OR (US); Reken Patel, Portland, OR (US); Richard Schenker, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/957,887

(22) Filed: Sep. 30, 2022

(65) Prior Publication Data

US 2024/0113177 A1 Apr. 4, 2024

(51) Int. Cl.
*H10D 62/10* (2025.01)
*H10D 30/01* (2025.01)
(Continued)

(52) U.S. Cl.
CPC ....... *H10D 84/0149* (2025.01); *H10D 30/019* (2025.01); *H10D 62/121* (2025.01);
(Continued)

(58) Field of Classification Search
CPC ............. H10D 84/0149; H10D 30/019; H10D 62/121; H10D 84/038; H10D 84/832;
(Continued)

(56) References Cited

U.S. PATENT DOCUMENTS

| | | | | |
|---|---|---|---|---|
| 10,096,604 B2 * | 10/2018 | Chi | .................... | H10D 84/0149 |
| 12,148,622 B2 * | 11/2024 | Huang | ............. | H01L 21/76825 |

(Continued)

OTHER PUBLICATIONS

U.S. Appl. No. 17/548,027, filed Dec. 10, 2021. 90 page.

*Primary Examiner* — Earl N Taylor
(74) *Attorney, Agent, or Firm* — Arcane Law PLLC

(57) ABSTRACT

An integrated circuit includes a first device having a first source or drain region, and a second device having a second source or drain region that is laterally adjacent to the first source or drain region. A conductive source or drain contact includes (i) a lower portion in contact with the first source or drain region, and extending above the first source or drain region, and (ii) an upper portion extending laterally from above the lower portion to above the second source or drain region. A dielectric material is between at least a section of the upper portion of the conductive source or drain contact and the second source or drain region. In an example, each
(Continued)

of the first and second devices is a gate-all-around (GAA) device having one or more nanoribbons, nanowires, or nanosheets as channel regions, or is a finFet structure having a fin-based channel region.

21 Claims, 12 Drawing Sheets

(51) Int. Cl.
  *H10D 30/62*  (2025.01)
  *H10D 64/23*  (2025.01)
  *H10D 84/01*  (2026.01)
  *H10D 84/03*  (2025.01)
  *H10D 84/83*  (2025.01)
(52) U.S. Cl.
  CPC ......... *H10D 84/038* (2025.01); *H10D 84/832* (2025.01); *H10D 30/024* (2025.01); *H10D 30/6219* (2025.01); *H10D 64/251* (2025.01); *H10D 84/0158* (2025.01); *H10D 84/834* (2025.01)
(58) Field of Classification Search
  CPC ............. H10D 30/024; H10D 30/6219; H10D 64/251; H10D 84/0158; H10D 84/834; H10D 30/6211; H10D 30/43; H10D 30/47; H10D 30/014; H10D 30/62; H10D 30/6757; H10D 30/6735; H10D 84/83
  See application file for complete search history.

(56) References Cited

U.S. PATENT DOCUMENTS

| | | | | |
|---|---|---|---|---|
| 2015/0364371 | A1* | 12/2015 | Yen ..................... | H01L 21/7685 |
| | | | | 438/666 |
| 2016/0005851 | A1* | 1/2016 | Song .................. | H10D 84/0193 |
| | | | | 257/401 |
| 2021/0134784 | A1* | 5/2021 | Kim .................... | H01L 23/5222 |
| 2022/0139911 | A1* | 5/2022 | Wei .................... | H01L 23/5226 |
| | | | | 257/365 |
| 2022/0223743 | A1* | 7/2022 | Cai ..................... | H10D 84/038 |
| 2022/0336664 | A1* | 10/2022 | Bae ..................... | H10D 62/121 |
| 2022/0384591 | A1* | 12/2022 | Lee ..................... | H10D 30/43 |
| 2023/0187441 | A1* | 6/2023 | Guler ................. | H10D 84/0149 |
| | | | | 257/365 |
| 2023/0197613 | A1* | 6/2023 | Majhi ................. | H10D 84/038 |
| | | | | 257/401 |
| 2023/0282575 | A1* | 9/2023 | Guler ................. | H10D 64/01 |
| 2023/0369218 | A1* | 11/2023 | Li ...................... | H10D 30/6757 |
| 2024/0038855 | A1* | 2/2024 | Cai ..................... | H10D 30/62 |
| 2024/0105605 | A1* | 3/2024 | Xie ..................... | H10D 88/101 |
| 2024/0105615 | A1* | 3/2024 | Lee ..................... | H01L 23/5286 |
| 2024/0194528 | A1* | 6/2024 | Xie ..................... | H10D 88/101 |

* cited by examiner

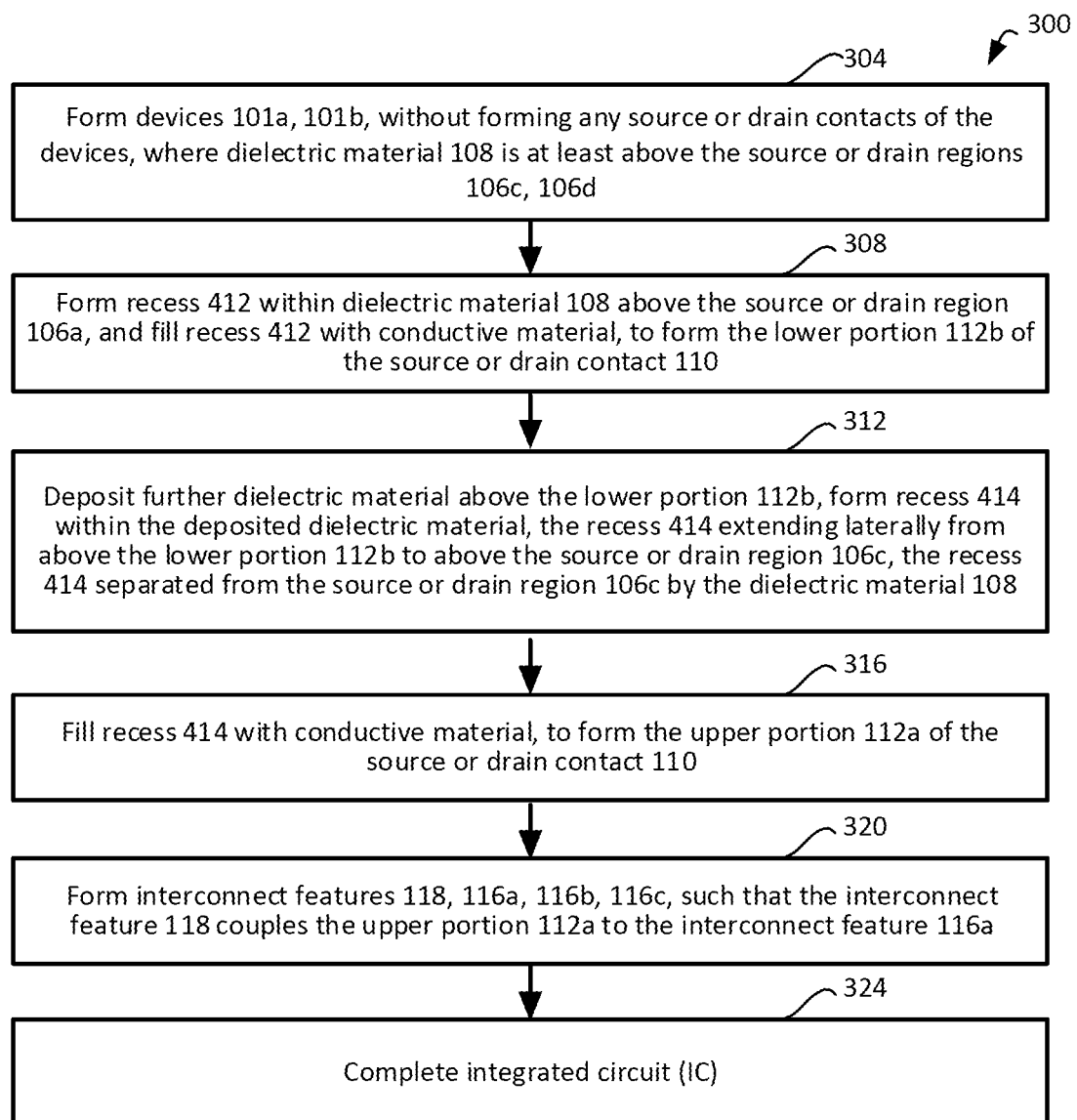

300

304

Form devices 101a, 101b, without forming any source or drain contacts of the devices, where dielectric material 108 is at least above the source or drain regions 106c, 106d

308

Form recess 412 within dielectric material 108 above the source or drain region 106a, and fill recess 412 with conductive material, to form the lower portion 112b of the source or drain contact 110

312

Deposit further dielectric material above the lower portion 112b, form recess 414 within the deposited dielectric material, the recess 414 extending laterally from above the lower portion 112b to above the source or drain region 106c, the recess 414 separated from the source or drain region 106c by the dielectric material 108

316

Fill recess 414 with conductive material, to form the upper portion 112a of the source or drain contact 110

320

Form interconnect features 118, 116a, 116b, 116c, such that the interconnect feature 118 couples the upper portion 112a to the interconnect feature 116a

324

Complete integrated circuit (IC)

FIG. 3

100
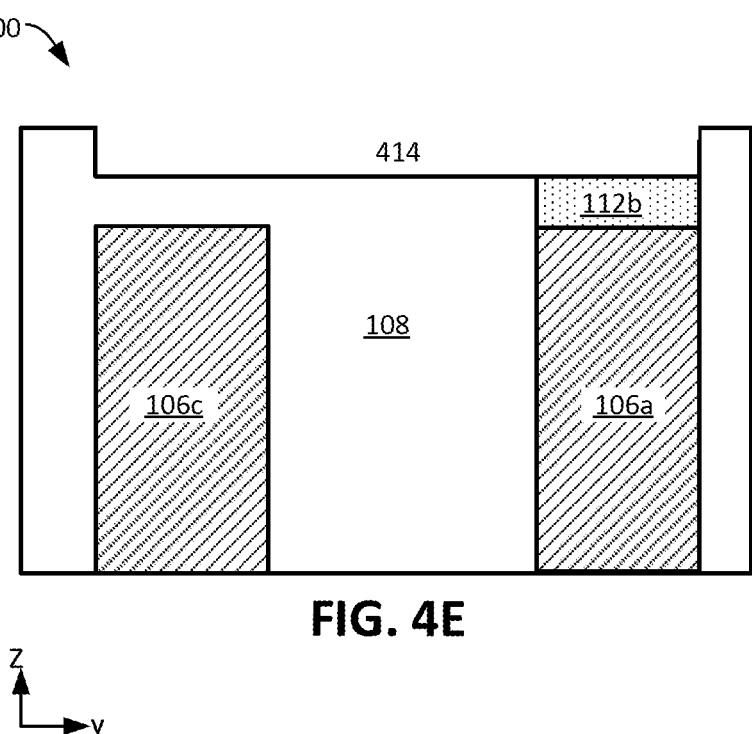
FIG. 4E
100
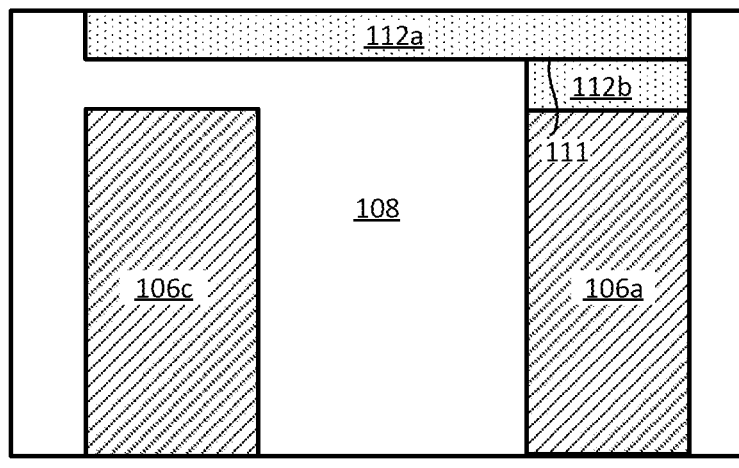
FIG. 4F

STACKED SOURCE OR DRAIN CONTACT FLYOVER

FIELD OF THE DISCLOSURE

The present disclosure relates to integrated circuits, and more particularly, to source or drain contacts of transistor devices.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the interconnection and routing of devices becomes challenging. Accordingly, there remain a number of non-trivial challenges with respect to forming semiconductor devices.

BRIEF DESCRIPTION OF THE DRAWINGS

FIG. 3 illustrates a flowchart depicting a method of forming the integrated circuit structure having a cantilevered source or drain contact structure, in accordance with an embodiment of the present disclosure.

FIGS. 4A, 4B, 4C, 4D, 4E, 4F, and 4G collectively illustrate cross-sectional views of an integrated circuit structure in various stages of processing in accordance with the methodology of FIG. 3, in accordance with an embodiment of the present disclosure.

Figure 1A:
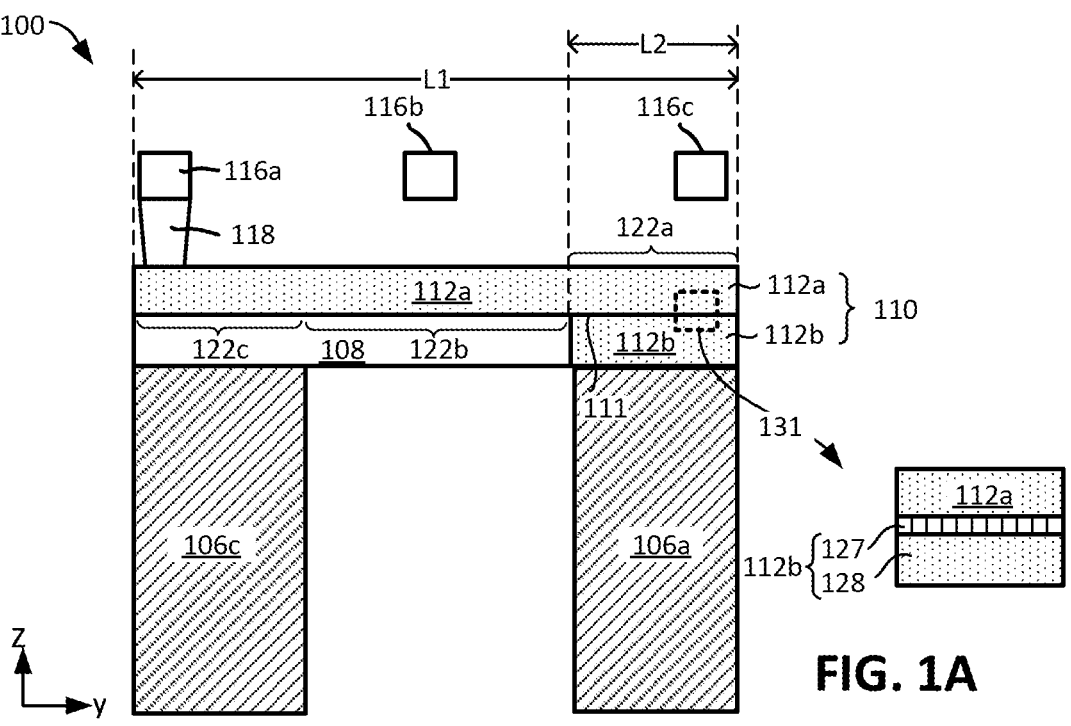
FIGS. 1A, 1B, 1C, and 1D illustrate various views of an integrated circuit structure comprising (i) a first device comprising a first source or drain region, and (ii) a second device comprising a second source or drain region, wherein a conductive source or drain contact comprises (i) a lower portion in contact with the first source or drain region, and extending above the first source or drain region, and (ii) an upper portion extending laterally from above the lower portion to above the second source or drain region, and wherein dielectric material is between at least a section of the upper portion and the second source or drain region, according to an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Techniques are provided herein to form semiconductor devices that include a cantilevered source or drain contact structure. In an example integrated circuit chip, a first source or drain region of a first device is laterally adjacent to a second source or region of a second device, where a conductive source or drain contact of the first source or drain region is cantilevered to be at least in part above the second source or drain region, and separated vertically from the second source or drain region by a dielectric material. For example, the second source or drain region may not be contacted, e.g., may not have a corresponding source or drain contact above the second source or drain region, resulting in unused physical space above the second source or drain region. This otherwise unused physical space above the second source or drain region may be opportunistically used, e.g., by extending the conductive contact of the first source or drain region from above the first source or drain region to above the second source or drain region. Such extension or cantilevering of the conductive contact facilitates in coupling the conductive contact with an interconnect feature (such as a conductive line) that is also above the second source or drain region, which helps in easing routing congestion in the integrated circuit chip.

In another example embodiment, an integrated circuit comprises a first device, and a laterally adjacent second device. The first device comprises a first source or drain region, and the second device comprises a second source or drain region that is laterally adjacent to the first source or drain region. A conductive source or drain contact has (i) a lower portion that is in contact with the first source or drain region and extends above the first source or drain region, and (ii) an upper portion that extends laterally from above the lower portion to above or otherwise toward the second source or drain region. In one such example, a dielectric material structure is between at least a section of the upper portion and the second source or drain region. In another example, the cantilevered upper portion of the conductive source or drain contact extends laterally from above the lower portion toward the second source or drain region but does not necessarily fly over the second source or drain region, thus at least partially opportunistically using otherwise unused space. In such a case, an end of the upper portion of the conductive source or drain contact is closer to the second source or drain region than it is to the first source or drain region but is still not in contact with the second source or drain region. In any such examples, each of the first and second devices may be, for instance, a gate-all-around (GAA) device having one or more nanoribbons, nanowires, or nanosheets as channel regions, or is a finFet structure having a fin-based channel region.

In another embodiment, an integrated circuit comprises a device including (i) a first source or drain region, (ii) a second source or drain region, (iii) a body comprising semiconductor material extending laterally from the first source or drain region to the second source or drain region, and (iv) a gate structure on the body. A first conductive source or drain contact has (i) a first lower portion extending from above the first source or drain region, and (ii) a first upper portion extending from above the first lower portion. A second conductive source or drain contact has (i) a second lower portion extending from above the second source or drain region, and (ii) a second upper portion extending from above the second lower portion. The first upper portion has a first dimension, and the second upper portion has a second dimension, where the first and second dimensions are measured in a lateral direction that is parallel to a length of the gate structure (and orthogonal to the channel direction laterally extending between the first source or drain region and the second source or drain region). In an example, the first dimension is at least 20% greater, or at least 40% greater than the second dimension.

In yet another embodiment, an integrated circuit comprises a first device including a first source or drain region, and a second device including a second source or drain region that is laterally adjacent to the first source or drain region. A conductive source or drain contact is in contact with the first source or drain region, and includes an upper portion that extends laterally from above the first source or drain region to above or otherwise towards the second source or drain region, wherein an end of the upper portion of the conductive source or drain contact is laterally separated from the second source or drain region by at most 4 nanometers. In an example, the conductive source or drain contact is not in contact with the second source or drain region, e.g., separated from the second source or drain region by a dielectric material. In an example, each of the first and second devices is a gate-all-around (GAA) device having one or more nanoribbons, nanowires, or nanosheets as channel regions, or is a finFet structure having a fin-based channel region.

Numerous configurations and variations will be apparent in light of this disclosure.

General Overview

As previously noted above, routing signals and/or power to and/or from individual transistors has become even more challenging, due to diminishing device sizes. For example, a metallization level (such as a lower metallization level or MO metallization level) may have one or more tracks (such as two, three, or four tracks, each comprising conductive lines traversing in a specific direction) to route power and/or signals to one or more rows of transistor devices. However, such a configuration may not be sufficient to route signals and/or powers, or may otherwise represent inefficient use of limited space. For instance, consider the example case where a first source or drain region of a first device is laterally adjacent to a second source or region of a second device. In some such cases, the second source or drain region may not be contacted, e.g., may not have a corresponding source or drain contact above the second source or drain region, resulting in unused physical space above the second source or drain region.

Thus, and in accordance with an embodiment of the present disclosure, techniques are provided herein to opportunistically use the unused physical space above a given source or drain region, for routing signals and/or power to the various devices. For example, a conductive source or drain contact of the first source or drain region is cantilevered to be at least in part within the otherwise unused space above second source or drain region.

For example, the source or drain contact has a lower portion, and an upper portion stacked above the lower portion. The lower portion is above and in contact with the first source or drain region. Note that there may be one or more silicide (or germanide or germanosilicide) layers, and/or a liner or barrier layer between the conductive fill material of the lower portion and the first source or drain region, where these layers may be considered to be part of the lower portion and/or part of the source or drain region. For instance, a liner layer may be used to improve adhesion and/or contact resistance, and/or a barrier layer can be used to prevent electromigration of metal into neighboring dielectric material. In any such examples, such layers may deposit on exposed sidewalls of the contact trench, as well as on other exposed surfaces of previously deposited materials (such as the upper surface of the lower portion of contact structure). Such intervening layers between the upper and lower portions of a given contact can be used to show the contact structure was formed with multiple depositions as variously described herein.

In an example, the upper portion and the lower portion of the source or drain contact may be formed using different processes, e.g., at different times in the process flow. In an example, there may be a liner or barrier layer between the conductive fill material of the lower portion and conductive fill material of the upper portion. In an example, even if such a liner or barrier layer is absent, there may be an interface (such as a seam or a grain boundary) between the conductive fill materials of the upper and lower portions, e.g., as the upper portion and the lower portion may be formed using different processes.

The lower portion is above and in contact with the first source or drain region, and the upper portion is stacked above the lower portion. For example, a first end section of the upper portion is above and in contact with the lower portion, and a second end section of the upper portion is cantilevered to extend above or toward the second source or drain region. Note that the second end section of the upper portion may be above the second source or drain region or otherwise extending toward it, but is nonetheless vertically separated and electrically isolated from the second source or drain region by a dielectric material. Thus, the upper portion appears to "fly over" or toward the second source or drain region, without actually contacting the second source or drain region. Accordingly, the source or drain contact is also referred herein to have a "flyover" or "cantilevered" structure.

As described below in further detail with respect to FIGS. 2A-2D, such a flyover like or cantilevered structure of the source or drain contact facilitates in reducing routing congestion in the integrated circuit device, by more efficiently using underutilized space. For example, assume that a lower metallization level (such as a MO metallization level) has a first conductive line (e.g., interconnect feature 216 of FIG. 2D) passing over the first source or drain region (e.g., region 160a), and a second conductive line (e.g., interconnect feature 116a of FIG. 2D) passing over the second source or drain region (e.g., region 160c). The second end section of the upper portion of the source or drain contact (e.g., contact 110), which is above the second source or drain region, may now be coupled to the second conductive line, e.g., through a conductive via.

Note that the above described first conductive line passing over the first source or drain region may not contact the first source or drain region, and may be used for some other routing purposes. Instead, the first source or drain region is now connected to the second conductive line passing over the second source or drain region, through (i) the lower portion, and (ii) the upper portion that extends from above the lower portion to above the second source or drain region. Thus, the cantilevered or flyover structure of the source or drain contact facilitates in connecting the first source or drain region to the second conductive line, while the first conductive line is used for other routing purposes, thereby facilitating in reducing routing congestion over the first and second source or drain regions.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some embodiments, such tools may be used to detect a first transistor device having a first source or drain region, a laterally adjacent second transistor device having a second source or drain region, and a source or drain contact of the first source or drain region, where the second source or drain region lacks a corresponding source or drain contact. In some embodiments, such tools may also be used to detect the source or drain contact having a lower portion that is above and in contact with the first source or drain region, and an upper portion that is cantilevered to extend from above the lower portion to above or otherwise toward the second source or drain region, where the cantilevered section of the upper portion is vertically separated from the second source or drain region by dielectric material, and where an interface (e.g., a seam, a grain boundary, or a barrier or liner layer) is between the upper and lower portions, in an example. Numerous configurations and variations will be apparent in light of this disclosure.

Architecture

FIGS. 1A, 1B, 1C, and 1D illustrate various views of an integrated circuit structure 100 comprising (i) a first device 101a comprising a first source or drain region 106a, and (ii) a second device 101b comprising a second source or drain region 106c, wherein a conductive source or drain contact 110 comprises (i) a lower portion 112b in contact with the first source or drain region 106a, and extending above the first source or drain region 106a, and (ii) an upper portion 112a extending laterally from above the lower portion 112b to above the second source or drain region 106c, and wherein dielectric material 108 is between at least a section of the upper portion 112a and the second source or drain region 106c, according to an embodiment of the present disclosure.

Figure 1B:
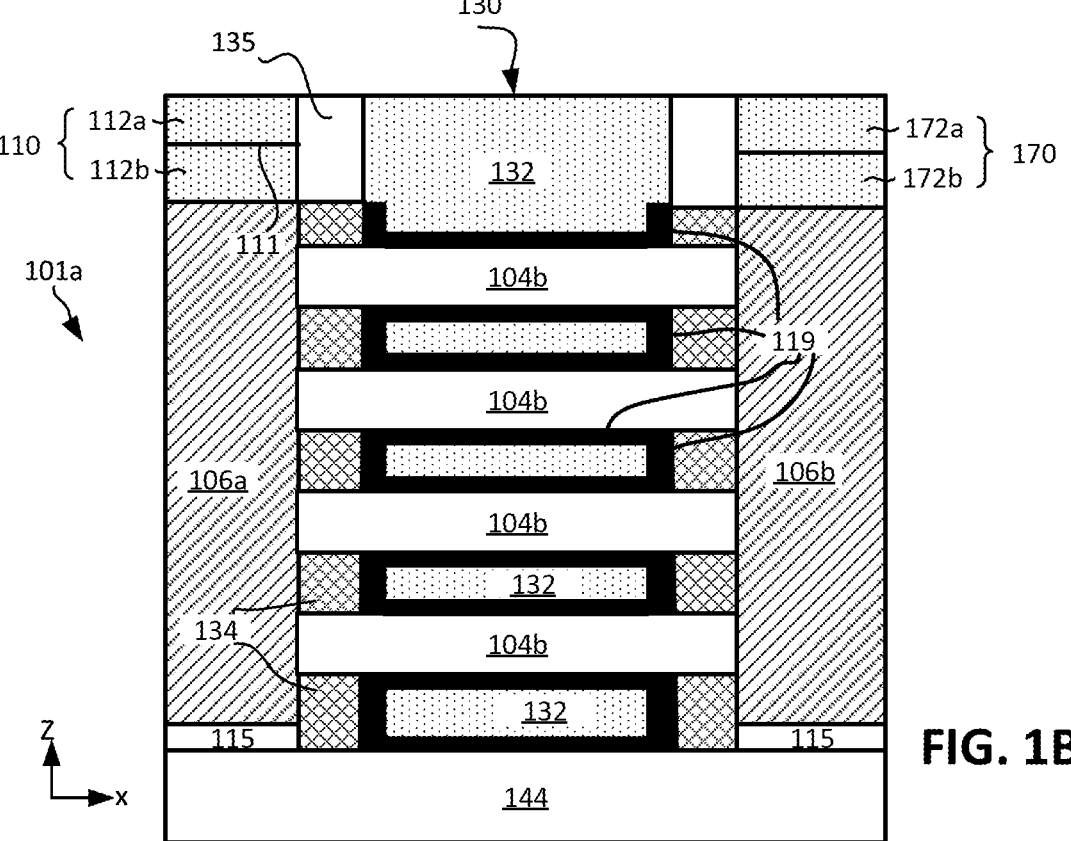
Figure 1C:
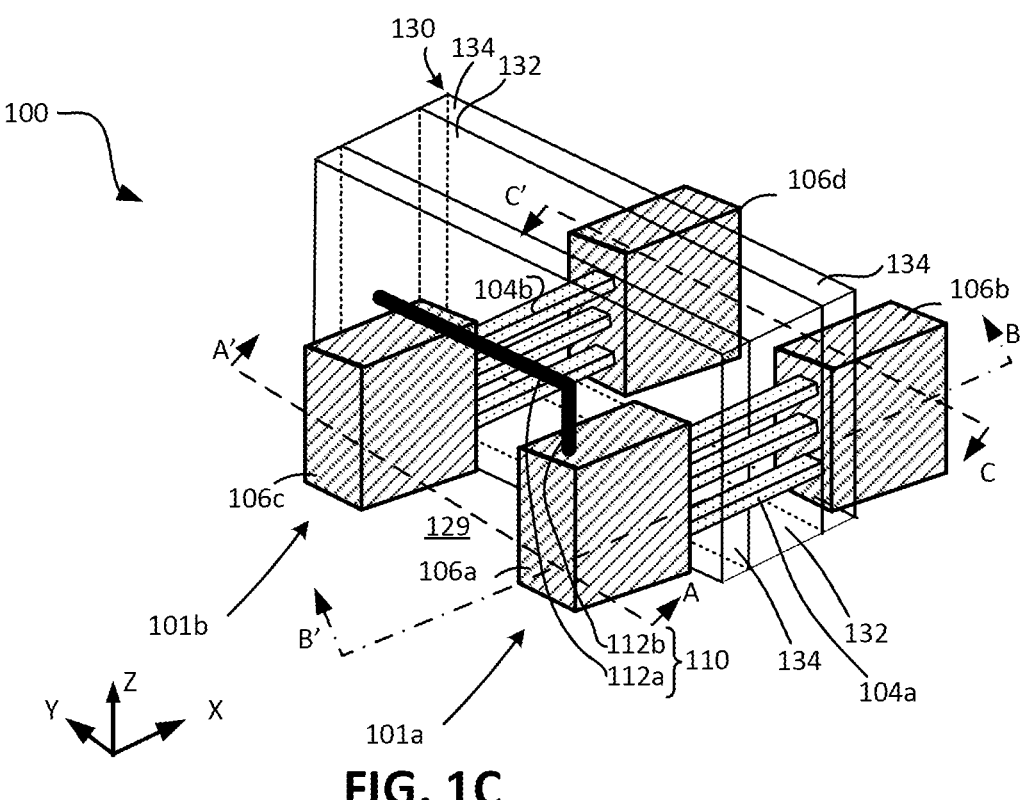
Figure 1D:
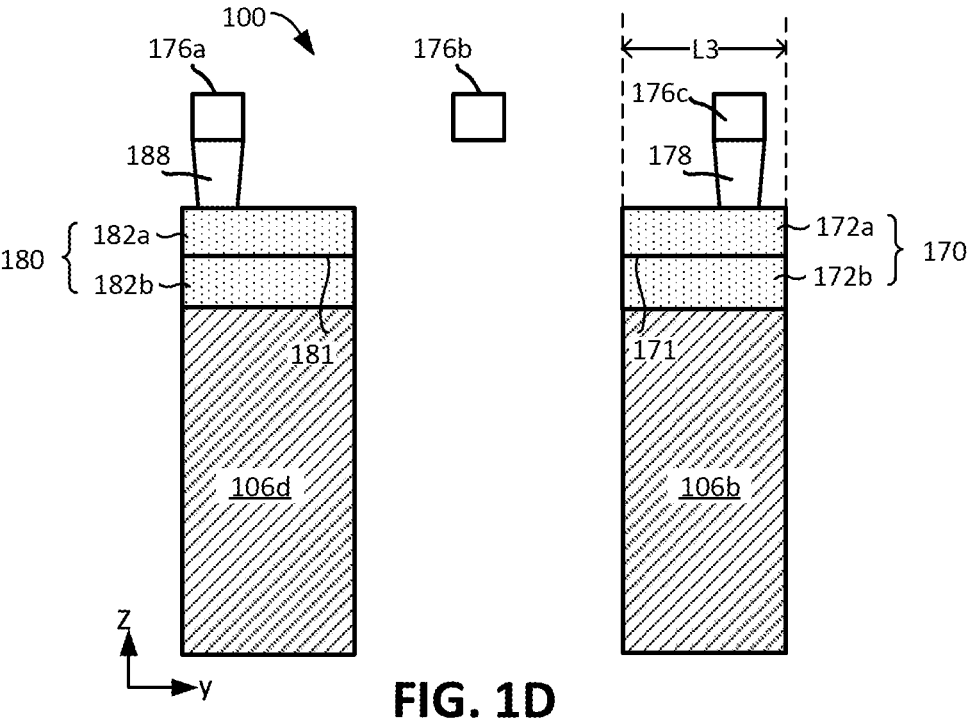

FIG. 1C illustrates a perspective view of the structure 100. Note that FIG. 1C schematically illustrates an approximate shape and the location of the source or drain contact 110 relative to the source or drain regions 106a, 106c, and does not illustrate one or more other components of the structure 100, such as the dielectric material 108, interconnect features 116a, 116b, 116c, 118 that are above the source or drain contact 110, and one or more other source or drain contacts (such as source or drain contacts 170, 180 of FIG. 1D). FIG. 1A is a cross-sectional view taken along a line A-A' of FIG. 1C, and illustrates the source or drain regions 106a, 106c and the source or drain contact 110. FIG. 1B is a cross-sectional view taken along a line B-B' of FIG. 1C, and illustrates detail of the device 101a. FIG. 1D is a cross-sectional view taken along a line C-C' of FIG. 1C, and illustrates the source or drain regions 106b, 106d, and corresponding source or drain contacts 170, 180, respectively.

In an example, each of semiconductor devices 101*a*, 101*b* may be non-planar metal oxide semiconductor (MOS) transistors, such as tri-gate (e.g., finFeT) or gate-all-around (GAA) transistors, although other transistor topologies and types could also benefit from the techniques provided herein. The illustrated embodiments herein use the GAA structure including nanoribbons as examples of channel regions. The term nanoribbon may also encompass other similar GAA channel region shapes such as nanowires or nanosheets. Note that the nanoribbons of a device may be replaced by nanosheets or nanowires of a GAA device, or by a fin-based structure to form a finFeT device.

The various illustrated semiconductor devices represent a portion of an integrated circuit that may contain any number of similar semiconductor devices. Thus, although two example devices 101*a*, 101*b* are illustrated (see FIG. 1C), there may be additional devices. For example, although FIG. 1C illustrates the devices 101*a* and 101*b* sharing a common gate structure 130, there may be one or more other devices that share the common gate structure 130 in one example. In another example, there may be a gate cut in the gate structure 130 between the devices 101*a*, 101*b*, such that each of the devices 101*a*, 101*b* has a corresponding separate gate structure.

As illustrated in FIG. 1C, device 101*a* comprises source and drain regions 106*a*, 106*b*, and device 101*b* comprises source and drain regions 106*c*, 106*d*. In the device 101*a*, the region 106*a* can be a source region and the region 106*b* can be a drain region in one example, or the region 106*a* can be a drain region and the region 106*b* can be a source region in another example, e.g., depending on the implementation of the circuit comprising the device 101*a*. Accordingly, each of the regions 106*a*, 106*b* are generally referred to herein as source or drain regions. Similarly, each of the regions 106*c*, 106*d* are generally also referred to herein as source or drain regions.

Each of devices 101*a*, 101*b* includes corresponding one or more nanoribbons 104*a*, 104*b*, respectively, that extend parallel to one another along an X-axis direction of FIGS. 1B and 1C (e.g., a direction into and out of the page in the cross-section view of FIG. 1A), between corresponding source and drain regions 106. For example, nanoribbons 104*a* extend laterally from the source or drain region 106*a* to the source or drain region 106*b* of the device 101*a*, to provide an active channel region for the device 101*a*. Similarly, nanoribbons 104*b* extend laterally from the source or drain region 106*c* to the source or drain region 106*d* of the device 101*b*, to provide an active channel region for the device 101*b*.

The semiconductor material of nanoribbons 104 may be formed from substrate 144, in an example. In some embodiments, devices 101*a*, 101*b* may each include semiconductor regions in the shape of fins that can be, for example, native to substrate 144 (formed from the substrate itself), such as silicon (Si) fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 104 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches. In an example, the nanoribbons 104 comprise an appropriate semiconductor material, such as silicon (Si), silicon germanium (SiGe), or another appropriate semiconductor material.

As can be seen, devices 101 are formed on a substrate 144. Any number of semiconductor devices 101 can be formed on substrate 144, but two are illustrated here as an example. Substrate 144 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 144 can be a semiconductor-on-insulator substrate having a desired semiconductor layer over a buried insulator layer (e.g., silicon over silicon dioxide). Alternatively, substrate 144 can be a multilayer substrate or superlattice suitable for forming nanowires or nanoribbons (e.g., alternating layers of silicon and SiGe, or alternating indium gallium arsenide and indium phosphide). Any number of substrates can be used. In some embodiments, a lower portion of (or all of) substrate 144 is removed and replaced with one or more backside interconnect layers to form backside signal and power routing, during a backside process.

Although not illustrated, adjacent semiconductor devices may be separated by a dielectric fill 129. Dielectric fill 129 provides shallow trench isolation (STI) between any adjacent semiconductor devices. Dielectric fill 129 can be any suitable dielectric material, such as silicon oxide (SiO), silicon nitride (SiN), silicon carbide (SiC), silicon oxycarbide (SiOC), silicon oxycarbonitride (SiOCN), or silicon oxynitride (SiON), for example.

According to some embodiments, the various source and drain regions 106*a*, 106*b*, 106*c*, 106*d* are epitaxial regions that are provided using an etch-and-replace process. In other embodiments source and drain regions 106 could be, for example, implantation-doped native portions of the semiconductor fins or substrate. Any semiconductor materials suitable for source and drain regions can be used (e.g., group IV and group III-V semiconductor materials). Source or drain regions 106 may include multiple layers such as liners and capping layers to improve contact resistance. In any such cases, the composition and doping of source and drain regions 106 may be the same or different, depending on the polarity of the transistors. In an example, for instance, one of the devices 101*a*, 106*b* is a p-type MOS (PMOS) transistor, and the other of the devices 106*a*, 106*b* is an n-type MOS (NMOS) transistor. Any number of source and drain configurations and materials can be used.

According to some embodiments, a lower dielectric layer 115 (see FIG. 1B) exists below the source and drain regions 106. Lower dielectric layer 115 can include any suitable dielectric material, such as silicon oxide or silicon nitride, and may be provided to isolate source and drain regions 115 from the substrate 144 (or from sub-fin regions, not illustrate).

According to some embodiments, the gate structure 130 extend over the nanoribbons 104*a*, 104*b* along a direction of the Y-axis. In one embodiment, the gate structure 130 includes a gate dielectric 119 (see FIG. 1B, not illustrated in FIG. 1C) that wraps around middle portions of each nanoribbon 104, and a gate electrode 132 that wraps around the gate dielectric 119. In some embodiments, the gate dielectric 119 may include a single material layer or multiple stacked material layers. The gate dielectric 119 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 119 is lanthanum. In some embodiments, the gate dielectric can be annealed to improve its quality when high-k dielectric material is used. In some embodiments, the gate dielectric 119 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer. The gate dielectric 119 is present around middle portions of each nanoribbon, and may also be present over substrate 144, and/or on inner sidewalls of the gate spacers 134.

The gate electrode 132 (see FIGS. 1B and 1C) of the gate structure 130 wraps around middle portions of individual nanoribbons 104a and 104b. Note that the middle portion of each nanoribbon 104 is between a corresponding first end portion and a second end portion, where the first end portions of the nanoribbons of a stack is wrapped around by corresponding first inner gate spacer 134, and where the second end portions of the nanoribbons of the stack is wrapped around by corresponding second inner gate spacer 134, where the inner gate spacers 134 for the device 101a are illustrated in FIG. 1B. Device 101b have similar inner gate spacers. The inner gate spacers 134 extend along the sides of the gate electrode 132, to isolate the gate electrode 132 from an adjacent source or drain region 106. Also illustrated in FIG. 1B for the device 101a are gate spacers 135 that are on upper portions of the gate electrode 132 (or a gate contact above the gate electrode 132). Gate spacers 135 can include any suitable dielectric material, such as silicon oxide or silicon nitride. Note that in the cross sectional view of FIG. 1C, both the inner gate spacers 134 and the gate spacers 135 are commonly labelled as 134, whereas FIG. 1B separately illustrated these two types of spacers.

In one embodiment, one or more work function materials (not illustrated in FIGS. 1A-1D) may be included around the nanoribbons 104. Note that work function materials are called out separately, but may be considered to be part of the gate electrodes. In this manner, a gate electrode 132 may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons. In still other embodiments, there may be insufficient room for any gate fill material, after deposition of work function material (i.e., a given gate electrode may be all work function material and no fill material). In an example, the gate electrodes 132 may include any sufficiently conductive material, such as a metal, metal alloy, or doped polysilicon. The gate electrodes may include a wide range of materials, such as polysilicon or various suitable metals or metal alloys, such as aluminum, tungsten, titanium, tantalum, copper, cobalt, molybdenum, titanium nitride, or tantalum nitride, for example. Numerous gate structure configurations can be used along with the techniques provided herein, and the present disclosure is not intended to be limited to any particular such configurations.

Illustrated in FIGS. 1A-1C is a source or drain contact 110 that contacts the source or drain region 106a of the device 101a. For example, for the specific circuit implemented in FIGS. 1A-1D, the source or drain region 106c of the device 101b need not have a corresponding source or drain contact. For example, the source or drain region 106c may be coupled to another source or drain region of an adjacent device through an internal conductive connection (not illustrated in FIGS. 1A-1D), and hence, the source or drain region 106c may not need a separate or dedicated source or drain contact to be formed above the source or drain region 106c. Accordingly, the physical space above the source or drain region 106c is unutilized by any contact of the source or drain region 106c. In an example, this physical space is instead utilized for routing connection of the source or drain region 106a, as illustrated.

For example, the source or drain contact 110 forms a contact for the source or drain region 106a. Note that the source or drain contact 110 is schematically illustrated using lines in the perspective view of FIG. 1C, and is illustrated in further detail in FIG. 1A.

As illustrated in FIGS. 1A and 1C, the source or drain contact 110 has a lower portion 112b, and an upper portion 112a stacked above the lower portion 112b. The lower portion 112b is in contact with the source or drain region 106a, and extends above the source or drain region 106a.

The upper portion 112a extends laterally from above the lower portion 112b to above the source or drain region 106c. For example, the upper portion 112a extends laterally in the direction of Y-axis, parallel to the length of the gate structure 130 and perpendicular to the length of the nanoribbons 104. As illustrated in FIG. 1A, the upper portion 112a has (i) a first section 122a above the lower portion 112b and/or the source or drain region 106a, (ii) a second section 122b that is above neither of the source or drain regions 106a, 106c, and (iii) a third section 122c above the source or drain region 106c.

The upper portion 122b comprises a monolithic and continuous body of conductive material, and the lower portion 122b comprises a monolithic and continuous body of conductive material. In an example, an interface 111, such as a seam or a grain boundary (or a layer 127 discussed herein below), is between (i) the monolithic and continuous body of conductive material of the upper portion 112a and (ii) the monolithic and continuous body of conductive material of the lower portion 112b, as illustrated. For example, the upper portion 112a and the lower portion 112b may be formed using different formation processes and at different times in the process flow, resulting in the interface 111 between the upper portion 112a and the lower portion 112b.

FIG. 1A illustrates an expanded view of a section 131 of the source or drain contact 110. As illustrated in the expanded view 131, in an example, a conductive layer 127 may be between the conductive material (such as metal or an alloy thereof) of the upper portion 112a and the conductive material (such as metal or an alloy thereof) of the lower portion 112b. The conductive layer 127 is a liner layer, also referred to as a barrier layer, or an encapsulation layer. In an example, the conductive layer 127 may also be present on one or more sidewalls of the upper portion 112a and/or the lower portion 112b. The conductive layer 127 acts as a liner or barrier layer, to prevent or reduce diffusion of the conductive fill material of the upper and/or lower portions into adjacent dielectric material. Suitable materials for the layer 127 include barrier layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN).

Note that the layer 127 can be considered to be a part of the upper portion 112a or the lower portion 112b. In the example of FIG. 1A, the lower portion 112b is illustrated to include the layer 127 and conductive fill material 128. In an example, depending on a manner in which the upper and lower portions are formed, the layer 127 and/or the interface 111 may be absent within the source or drain contact 110.

Although not illustrated, there may be one or more layers between the conductive fill material 128 of the lower portion 112b and the source or drain region 106a, such as a silicide or germanide (or germanosilicide) layer and/or a liner layer, and these layers may be considered to be part of the lower portion 112b, or part of the source or drain region 106a.

In an example, the conductive fill materials for the upper portion 112a and the lower portion 112b (such as the conductive fill material 128 of the lower portion 112b labelled in FIG. 1A) comprise suitable conductive materials, such as one or more metals, one or more alloys thereof, or another appropriate type of conductive material. Examples include, but are not limited to, pure copper, ruthenium, molybdenum, tungsten, aluminum, an alloy such as copper-tin (CuSn), copper indium (CuIn), copper-antimony (CuSb), copper-bismuth (CuBi), copper-rhenium (CuRe), and/or any other suitable conductive material.

As illustrated in FIG. 1A, the upper portion 112a has a length L1 and the lower portion 112b has a length L2, where lengths L1 and L2 are measured along a direction of the Y-axis, which is parallel to a length of the gate structure 130 (and perpendicular to a length of the nanoribbons 104). In an example, the length L1 is greater than the length L2 by at least 10%, or at least 20%, or at least 30%, or at least 40%, or at least 50%, or at least 80%, or at least 100%, or at least 150%, or at least 200%, or at least 250%, or at least 300%, or at least 400%, or at least 500%, for example.

In one embodiment, the upper portion 112a is electrically isolated from the source or drain region 106c, e.g., by dielectric material 108. For example, the dielectric material 108 is below the section 122c and also possibly below at least a part of the section 122b of the upper portion 112a. Thus, even though the upper portion 112a extends above the source or drain region 106c, the upper portion 112a is electrically isolated from the source or drain region 106c by the dielectric material 108.

The source or drain contact 110 forms a cantilever type structure over the source or drain region 106c, and flies over the source or drain region 106c without making contact with the source or drain region 106c. Accordingly, the source or drain contact 110 is also referred to herein as a "flyover" above the source or drain region 106c.

Also illustrated in FIG. 1A are conductive interconnect features 116a, 116b, 116c above the upper portion 112a. For example, the upper portion 112a extends in the Y-axis direction of FIG. 1A, while the interconnect features 116a, 116b, 116c may be conductive lines extending in the X-axis direction, e.g., in and out of the plane of the page. Merely as an example, the interconnect features 116a, 116b, 116c are part of a metallization level (e.g., Mo metallization level) of the structure 100. A conductive interconnect feature 118, which may be a conductive via extending in the vertical or Z-axis direction, couples the upper portion 112a with the interconnect feature 116a, in the example of FIG. 1A. Thus, the source or drain region 106a is coupled to the interconnect feature 116a through the cantilevered source or drain contact 110 and the interconnect feature 118.

Referring now to FIG. 1D, illustrated are the source or drain region 106b of the device 101a, and the source or drain region 106d of the device 101b. As previously mentioned, FIG. 1D is a cross-sectional view taken along the line C-C' of FIG. 1C, and illustrates the source or drain regions 106b, 106d, and corresponding source or drain contacts 170, 180, respectively.

The source or drain contact 170 is above and in contact with the source or drain region 160b, and the source or drain contact 180 is above and in contact with the source or drain region 160d. In an example, the source or drain contact 170 comprises a lower portion 172b, and an upper portion 172a above the lower portion 172b, with an interface 171 (e.g., comprising a seam or grain boundary) therebetween. Similarly, the source or drain contact 180 comprises a lower portion 182b, and an upper portion 182a above the lower portion 182b, with an interface 181 (e.g., comprising a seam or grain boundary) therebetween. Similar to the layer 127 of the source or drain contact 110, the source or drain contacts 170, 180 may also include a liner (or barrier or encapsulation) layer between conductive fill materials of the corresponding upper and lower portions.

However, unlike the source or drain 110 in which the upper portion 112a extended above another source or drain region 106c, the upper portions 172a, 182a do not extend from any other source or drain region, as illustrated in FIG. 1D. For example, the upper portion 172a is coupled to an interconnect feature 178 (e.g., which is a conductive via extending vertically in the Z-axis direction), which is coupled to an interconnect feature 176c (e.g., which is a conductive via extending laterally in the X-axis direction). Similarly, the upper portion 182a is coupled to an interconnect feature 188 (e.g., which is a conductive via extending vertically in the Z-axis direction), which is coupled to an interconnect feature 176a (e.g., which is a conductive via extending laterally in the X-axis direction). As illustrated, the interconnect feature 178 is above the source or drain region 106b, and the interconnect feature 188 is above the source or drain region 106d.

As illustrated in FIG. 1D, one or both the upper portions 172a, 182a have a length L3 in the direction of Y-axis, i.e., parallel to a length of the gate structure 130. In an example, the length L1 of the upper portion 112a (see FIG. 1A) is greater than the length L3 of the upper portions 172a and/or 182a (see FIG. 1D) by at least 10%, or at least 20%, or at least 30%, or at least 40%, or at least 50%, or at least 80%, or at least 100%, or at least 150%, or at least 200%, or at least 250%, or at least 300%, or at least 400%, or at least 500%, for example.

Figure 1E:
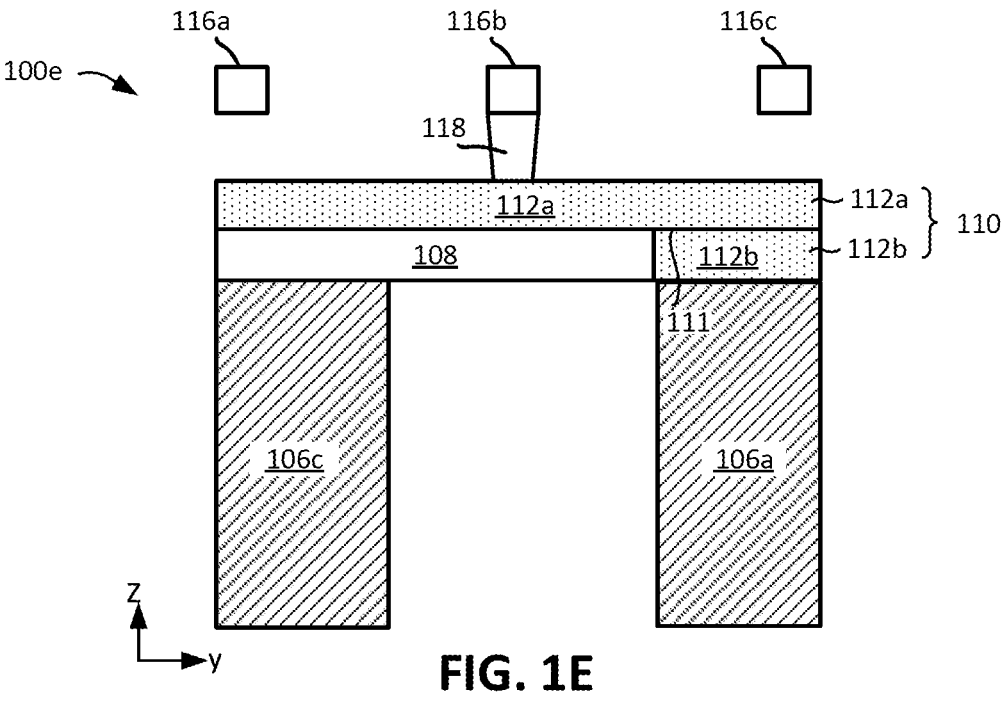
FIG. 1E illustrates a cross-sectional view of another integrated circuit structure that is at least in part similar to the integrated circuit structure of FIGS. 1A-1D, and where the upper portion of the cantilevered source or drain contact in the structure of FIG. 1E is coupled to a different interconnect feature relative to the structure of FIG. 1A, according to an embodiment of the present disclosure.

FIG. 1E illustrates a cross-sectional view of another integrated circuit structure 100e that is at least in part similar to the integrated circuit structure 100 of FIGS. 1A-1D, and where the upper portion 112a of the cantilevered source or drain contact 110 in the structure 100e of FIG. 1E is coupled to a different interconnect feature 116b relative to the structure 100 of FIG. 1A, according to an embodiment of the present disclosure.

Thus, the upper portion 112a of the structure 100 of FIG. 1A is coupled to the interconnect feature 116a, through the interconnect feature 118. In contrast, in the example of FIG. 1E, the upper portion 112a is coupled to the interconnect feature 116b through the interconnect feature 118. Thus, depending on the implementation the signal routing network, any of the interconnect features 116a or 116b may be used to route signals of the upper portion 112a of the source or drain contact 110.

Figure 1F:
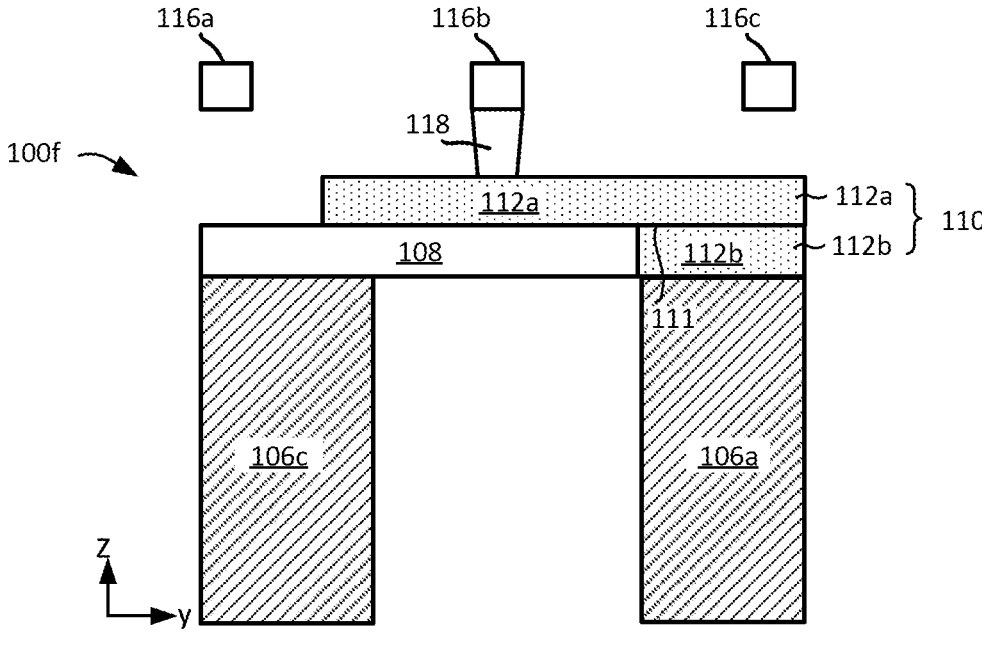
FIG. 1F illustrates a cross-sectional view of another integrated circuit structure that is at least in part similar to the integrated circuit structure of FIGS. 1A-1D, and where the upper portion of the cantilevered source or drain contact in the structure of FIG. 1F extends only partially above the second source or drain region, according to an embodiment of the present disclosure.

FIG. 1F illustrates a cross-sectional view of another integrated circuit structure 100f that is at least in part similar to the integrated circuit structure 100 of FIGS. 1A-1D, and where the upper portion 112a of the cantilevered source or drain contact 110 in the structure 100f of FIG. 1F extends only partially above the second source or drain region 106c, according to an embodiment of the present disclosure. Thus, while in FIG. 1A the upper portion 112a of the source or drain contact 110 extended above substantially an entire portion of the source or drain region 106c, the upper portion 112a of the source or drain contact 110 in FIG. 1F extends above only a portion of the source or drain region 106c.

Figures 1G, 1H:
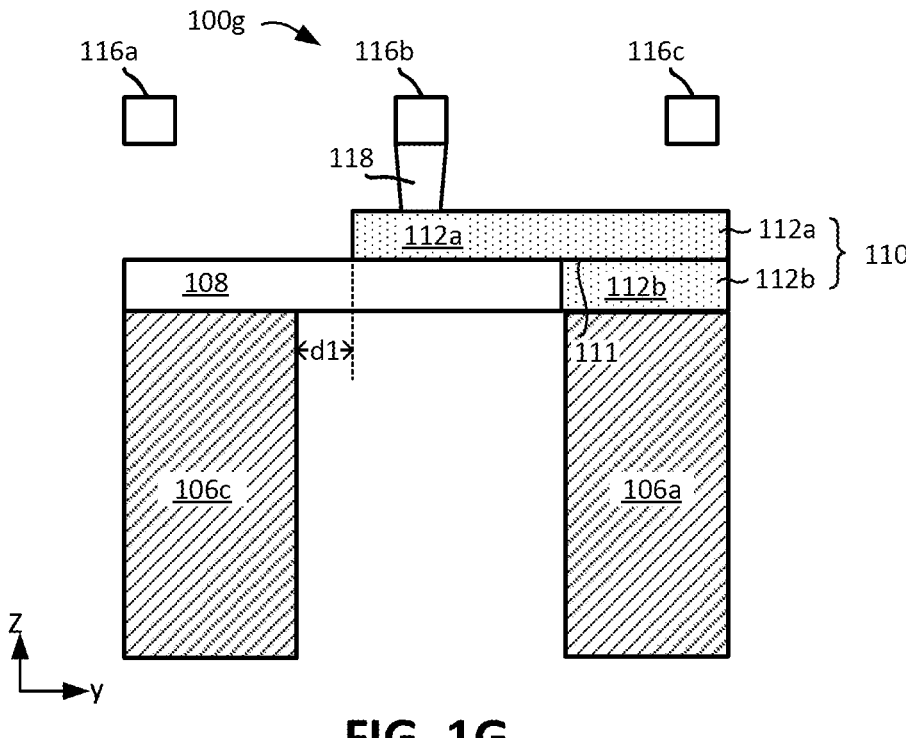
FIG. 1G illustrates a cross-sectional view of another integrated circuit structure that is at least in part similar to the integrated circuit structure of FIGS. 1A-1D, and where the upper portion of the cantilevered source or drain contact in the structure of FIG. 1G does not extend above the second source or drain region, according to an embodiment of the present disclosure.
FIG. 1H illustrates a cross-sectional view of another integrated circuit structure that is at least in part similar to the integrated circuit structure of FIGS. 1A-1D, and where the upper portion of the cantilevered source or drain contact in the structure of FIG. 1H extends above and beyond the second source or drain region, according to an embodiment of the present disclosure.

FIG. 1G illustrates a cross-sectional view of another integrated circuit structure 100g that is at least in part similar to the integrated circuit structure 100 of FIGS. 1A-1D, and where the upper portion 112a of the cantilevered source or drain contact 110 in the structure 100g of FIG. 1G does not extend above the second source or drain region 106c, according to an embodiment of the present disclosure. Thus, while in FIG. 1A the upper portion 112a of the source or drain contact 110 extended above substantially an entire portion (or at least a part of) of the source or drain region 106c, the upper portion 112a of the source or drain contact 110 in FIG. 1G does not extend above the source or drain region 106c. The upper portion 112a in FIG. 1G is cantilevered to extend toward the source or drain region 106c. For example, an end of the upper portion 112a (e.g., the left end in FIG. 1G) is closer to the source or drain region 106c than it is to the source or drain region 106a, but not in contact with the source or drain region 106c. In an example, the end of the upper portion 112a (e.g., the left end of the upper portion 112a in FIG. 1G) closer to the source or drain region 106c is at a lateral distance dl from the source or drain region 106c. For example, an end portion of the source or drain region 106c (e.g., the right edge of the source or drain region 106c) is at least in part on a first vertical plane, the end of the upper portion 112a (e.g., the left end in FIG. 1G) is at least in part on a second vertical plane, and where the first and second vertical planes are separated horizontally or laterally by distance dl. In an example, the distance dl is less than 8 nm, or less than 6 nm, or less than 4 nm, or less than 2 nm, or less than 1 nm. For example, the distance dl is less than a threshold distance, such that without the dielectric material 108, there may be chances of electrical short between the upper portion 112a and the source or drain region 106c. Thus, in FIG. 1G, the dielectric material 108 electrically separates the upper portion 112a and the source or drain region 106c.

FIG. 1H illustrates a cross-sectional view of another integrated circuit structure 100h that is at least in part similar to the integrated circuit structure 100 of FIGS. 1A-1D, and where the upper portion 112a of the cantilevered source or drain contact 110 in the structure 100h of FIG. 1H extends above and beyond the second source or drain region 106c, according to an embodiment of the present disclosure. Thus, while in FIG. 1A the upper portion 112a of the source or drain contact 110 extended above the source or drain region 106c, the upper portion 112a of the source or drain contact 110 in FIG. 1G extends above the source or drain region 106c, and extends further beyond the source or drain region 106c. For example, the interconnect feature 118 in FIG. 1H now couples the upper portion 112a to an interconnect feature 116d that is one a first side (e.g., left side) of the source or drain region 106c, where the source or drain region 106a is on an opposing second side (e.g., right side) of the source or drain region 106c.

FIGS. 2A-2D schematically illustrate an example application of the cantilevered source or drain contact 110 of FIGS. 1A-1D, according to an embodiment of the present disclosure. FIGS. 2A-2D are schematic top views of a section of an integrated circuit that includes the structure 100 of FIGS. 1A-1D. Note that the positions and sizes of various components in FIGS. 2A-2D are merely schematic, and does not accurately represent actual positions and/or sizes of these components.

Figure 2A:
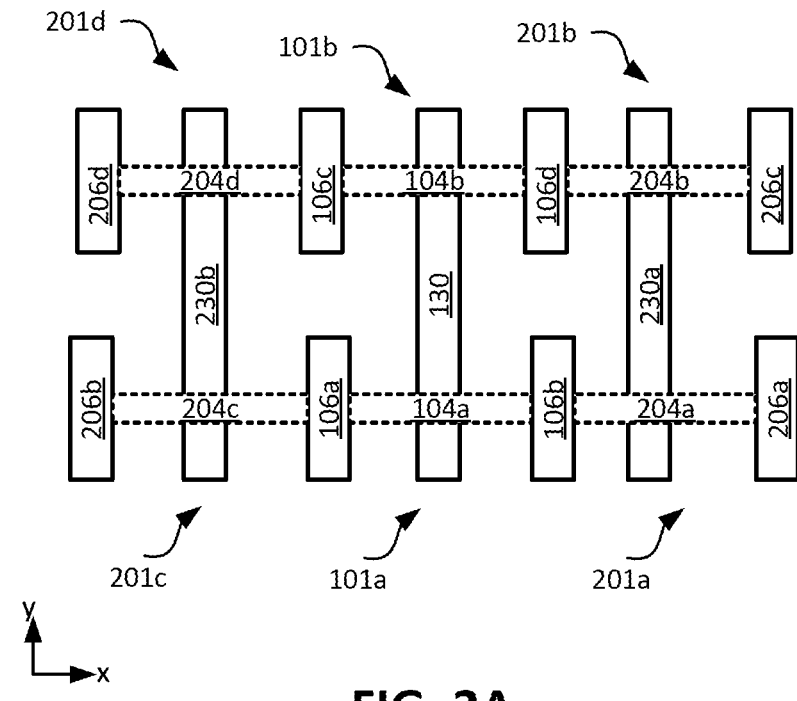
FIGS. 2A-2D schematically illustrate an example application of a cantilevered source or drain contact structure, according to an embodiment of the present disclosure.

Referring to FIG. 2A, illustrated are devices 101a, 101b, 201a, 201b, 201c, 201d. The device 101a (see structure 100 discussed above) comprises source or drain regions 106a, 106b, gate structure 130, and one or more nanoribbons 104a extending laterally from the source or drain region 106a to the source or drain region 106b. Note that the nanoribbons may be wrapped around by corresponding gate structures, and hence, may not be visible in the top view. Accordingly, the various nanoribbons of the various devices are illustrated using dotted lines in FIG. 2A, and are not illustrated in FIGS. 2B-2D for purposes of illustrative clarity. The device 101b (see structure 100 discussed above) comprises source or drain regions 106c, 106d, gate structure 130, and one or more nanoribbons 104b extending laterally from the source or drain region 106c to the source or drain region 106d. Note that as discussed with respect to FIGS. 1A-1D, the gate structure 130 is common or shared between the devices 101a, 101b.

Similarly, the device 201a comprises source or drain regions 106b, 206a, gate structure 230a, and one or more nanoribbons 204a extending laterally from the source or drain region 106b to the source or drain region 206a. Similarly, the device 201b comprises source or drain regions 106d, 206c, gate structure 230a, and one or more nanoribbons 204b extending laterally from the source or drain region 106d to the source or drain region 206c. Similarly, the device 201c comprises source or drain regions 206b, 106a, gate structure 230b, and one or more nanoribbons 204c extending laterally from the source or drain region 206b to the source or drain region 106a. Similarly, the device 201d comprises source or drain regions 206d, 106c, gate structure 230b, and one or more nanoribbons 204d extending laterally from the source or drain region 206d to the source or drain region 106c.

Figure 2B:
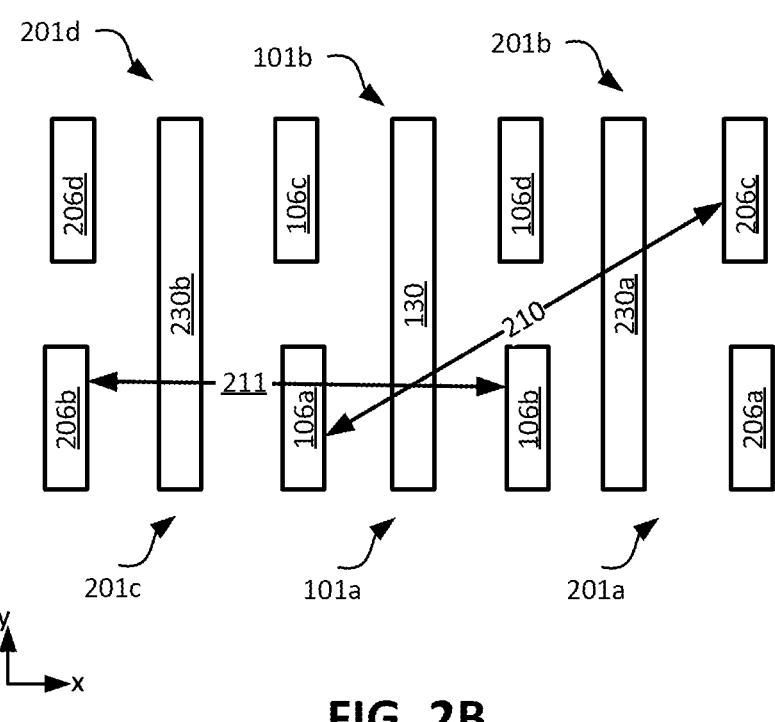

Referring now to FIG. 2B (note that the nanoribbons are not illustrated in FIGS. 2B-2D), in one example, it may be intended to interconnect source or drain region 106a and source or drain region 206c, as schematically illustrated using arrow 210 in FIG. 2B. Similarly, in one example, it may be intended to interconnect source or drain region 206b and source or drain region 106b, as schematically illustrated using arrow 211 in FIG. 2B. Such interconnections are mere examples, and are specific to the design of the circuit for which the various structures discussed herein are to be used.

Figure 2C:
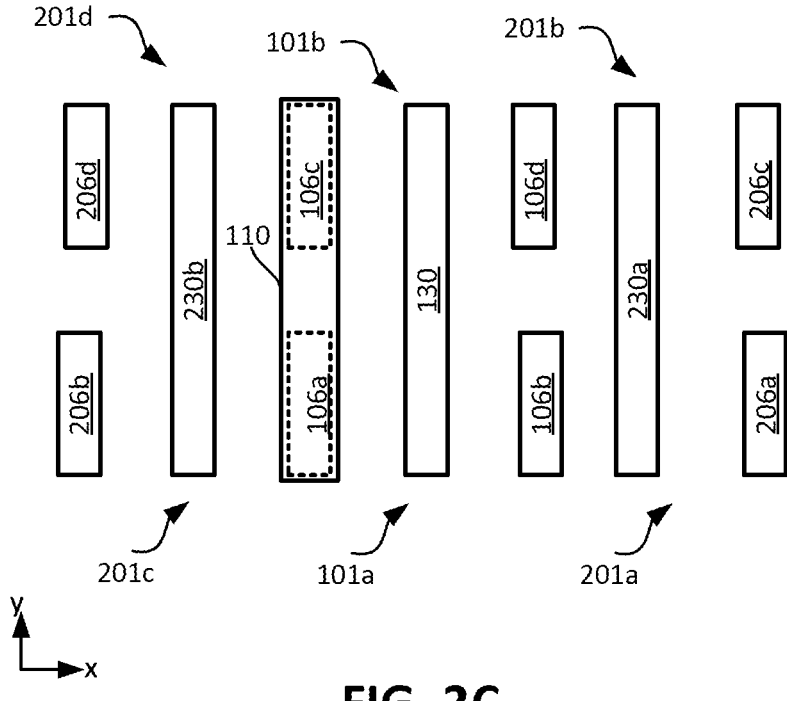

Referring now to FIG. 2C, the cantilevered and flyover source or drain contact 110 is formed to extend from above the source or drain region 106a to above the source or drain region 106c, as described above with respect to FIGS. 1A-1D. Note that the source or drain contact 110 is above the source or drain regions 106a, 106c, and hence, at least a part of the source or drain regions 106a, 106c may not be visible in the top view of FIG. 2B, and hence, the source or drain regions 106a, 106c are illustrated in dotted lines in FIGS. 2C, 2D.

Figure 2D:
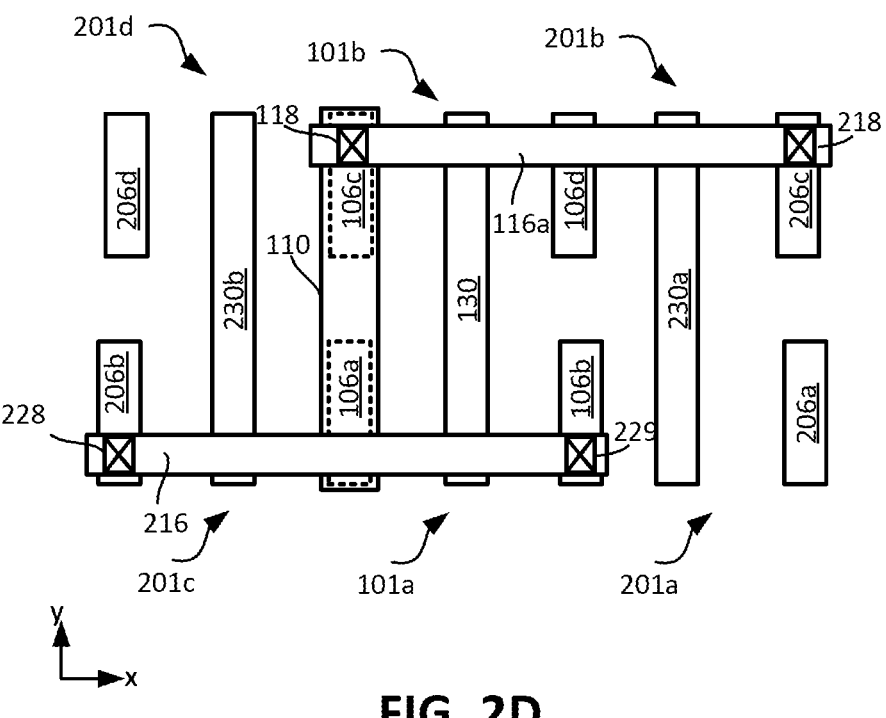

Referring now to FIG. 2D, a section of the source or drain contact 110 (which is above the source or drain region 106c) is coupled to the interconnect feature 116a through the interconnect features 118 an 116a, as illustrated in FIG. 2D, and as also discussed with respect to FIG. 1A. Note that in this example, the interconnect feature 118 is a conductive via (schematically illustrated using a box with a cross) extending vertically from the upper portion 112a of the source or drain contact 110 to the conductive interconnect feature 116a (which is a conductive line), where the interconnect feature 116a is above the source or drain contact 110. The interconnect feature 116a extends from above the source or drain contact 110 to above the source or drain region 206c, e.g., in the X-axis direction. The interconnect feature 116a is coupled to a source or drain contact of the source or drain region 206c through another conductive via 218. Note that the source or drain contact of the source or drain region 206c need not have the flyover shape of the source or drain contact 110, and the source or drain contact of the source or drain region 206c may be similar to any of the source or drain contacts 170 or 180 discussed with respect to FIGS. 1A-1D.

Also, another interconnect feature 216 (which is a conductive line extending in the X-axis direction) extends from above the source or drain region 206b to above the source or drain region 106b. The interconnect feature 216 is coupled to a source or drain contact of the source or drain region 206b through another conductive via 228, and the interconnect feature 216 is also coupled to the source or drain contact 170 (see FIG. 1D) of the source or drain region 106b through another conductive via 229, as illustrated in FIG. 2D.

FIG. 3 illustrates a flowchart depicting a method 300 of forming the integrated circuit structure 100 of FIGS. 1A-1D, in accordance with an embodiment of the present disclosure. FIGS. 4A, 4B, 4C, 4D, 4E, 4F, and 4G collectively illustrate cross-sectional views of an integrated circuit structure in various stages of processing in accordance with the methodology 300 of FIG. 3, in accordance with an embodiment of the present disclosure. FIGS. 3 and 4A-4G will be discussed in unison.

Note that the method 300 and accompanying figures illustrate formation of the source or drain contact 110. Other source or drain contacts (such as source or drain contacts 170, 180 of FIG. 1D) may be formed using appropriate techniques for forming source or drain contacts of a transistor device. The cross-sectional view of FIGS. 4A-4G are along the same plane as that of FIG. 1A.

Figure 4A:
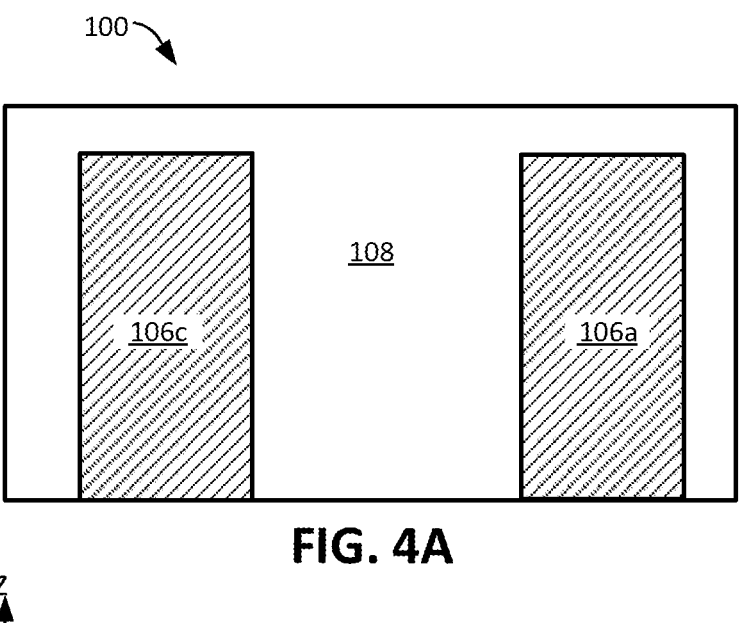

Referring to FIG. 3, the method 300 includes, at 304, forming devices 101a, 101b, without forming any source or drain contacts of the devices, e.g., as illustrated in FIG. 4A. In an example, dielectric material 108 is at least above the source or drain regions 106c, 106d. The devices 101a, 101b (without any source or drain contacts) can be formed using any appropriate techniques for forming GAA or finFeT devices, as will be appreciated.

Figure 4B:
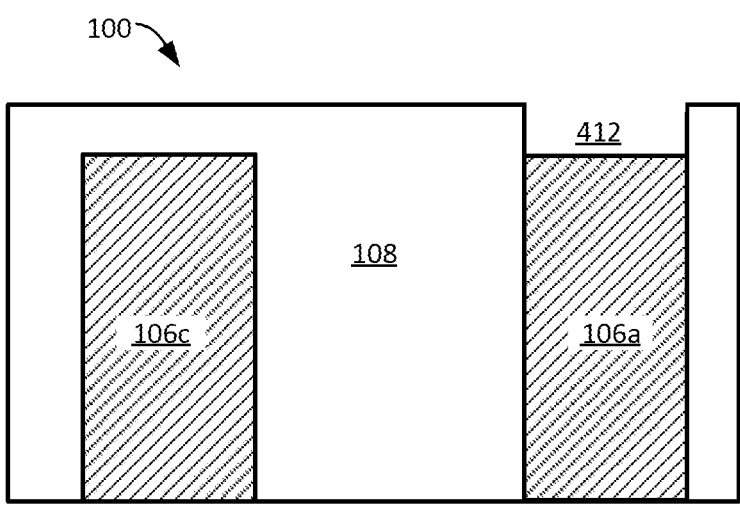
Figure 4C:
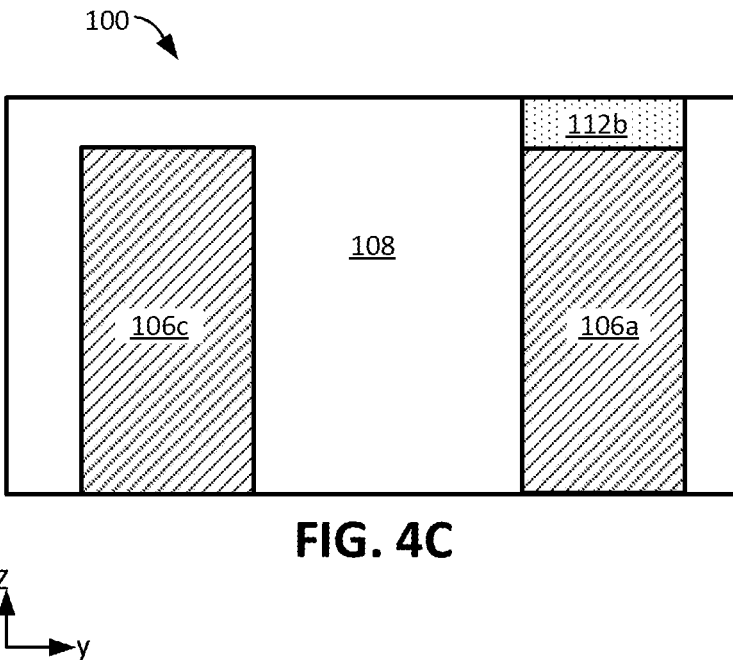

Referring again to FIG. 3, the method 300 then proceeds from 304 to 308, where recess 412 is formed within dielectric material 108 above the source or drain region 106a, as illustrated in FIG. 4B. The recess 412 may be formed using an appropriate masking and etching technique, with the source or drain region 106a acting as an etch stop layer. Also at 308, the recess 412 is filled with conductive material, to form the lower portion 112b of the source or drain contact 110, as illustrated in FIG. 4C. Recall that, in an example, a liner or barrier layer, and/or a silicide, germanide, and/or germanosilicide layer may be formed, prior to depositing the conductive fill material of the lower portion 112b of the source or drain contact 110. In an example, the conductive fill material of the lower portion 112b of the source or drain contact 110 may be deposited using an appropriate deposition technique, such as electroplating, chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example.

Figure 4D:
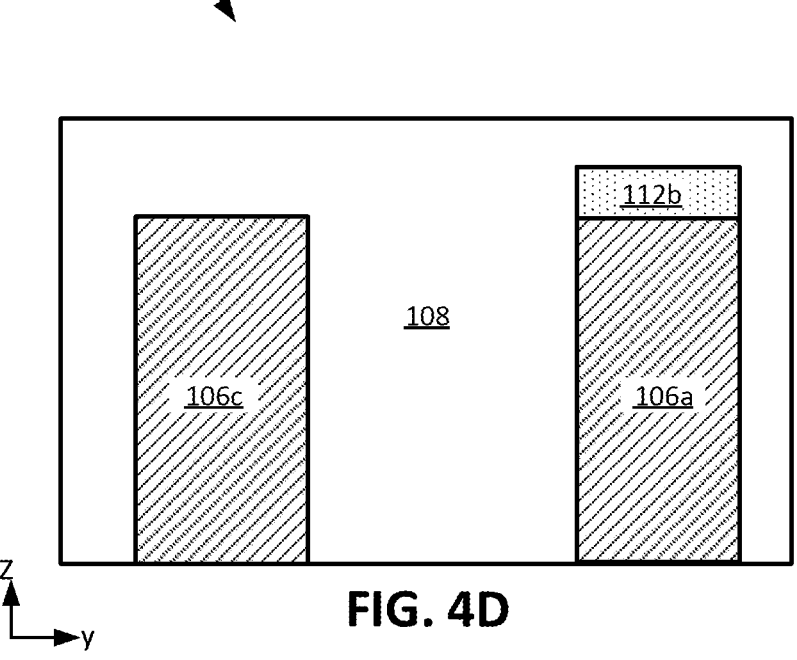

Referring again to FIG. 3, the method 300 then proceeds from 308 to 312, where further dielectric material is deposited above the lower portion 112b, as illustrated in FIG. 4D, and recess 414 is formed within the deposited dielectric material, as illustrated in FIG. 4E. Note that the further deposited dielectric material may be same as the dielectric material 108, or may be different, although FIG. 4D shows the dielectric material 108 being further deposited. As illustrated in FIG. 4E, the recess 414 extends laterally from above the lower portion 112b to above the source or drain region 106c, and the recess 414 is separated from the source or drain region 106c by the dielectric material 108.

Referring again to FIG. 3, the method 300 then proceeds from 312 to 316, where the recess 414 is filled with conductive material, to form the upper portion 112a of the source or drain contact 110, as illustrated in FIG. 4F. Recall that, in an example, a liner or barrier layer (such as layer 127, see FIG. 1A) may be formed, prior to depositing the conductive fill material. In an example, the conductive fill material of the upper portion 112a of the source or drain contact 110 may be deposited using an appropriate deposition technique, such as electroplating, CVD, PVD, ALD, VPE, MBE, or LPE, for example.

Figure 4G:
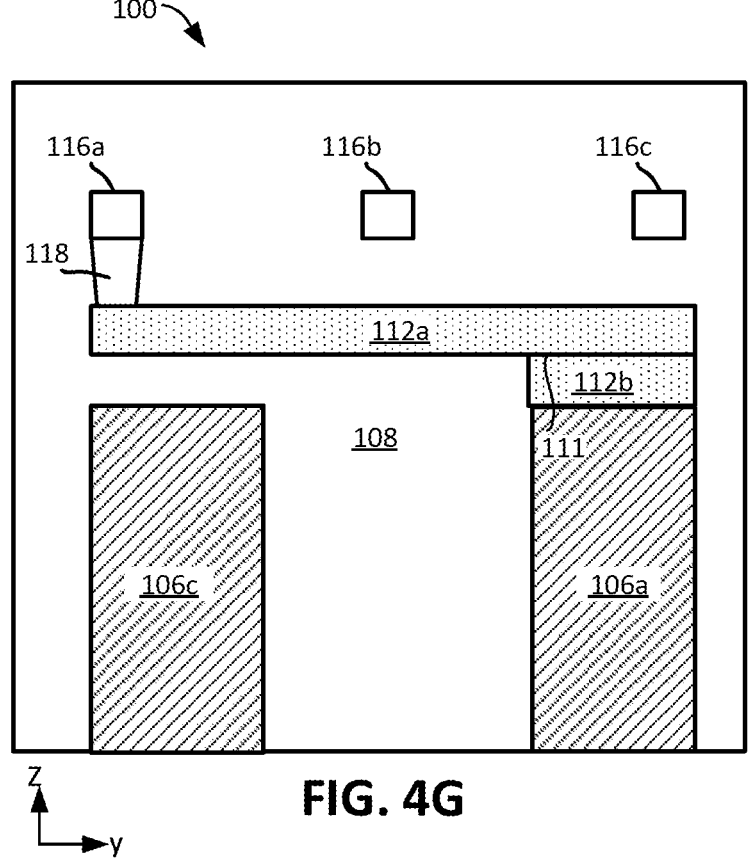

Referring again to FIG. 3, the method 300 then proceeds from 316 to 320, where interconnect features 118, 116a, 116b, 116c are formed, such that the interconnect feature 118 couples the upper portion 112a to the interconnect feature 116a, as illustrated in FIG. 4G. In an example, the interconnect features 118, 116a, 116b, 116c are formed using appropriate techniques for forming interconnect features above one or more transistor devices.

Note that while FIG. 1A illustrated the dielectric material 108 between the upper portion 112a and the source or drain region 106c, in the example of FIG. 4G, the dielectric material 108 is above and below various other components as well. In an example, location of the dielectric material 108 is implementation specific, and based on a manner in which the structure 100 is formed.

Note that the processes in method 300 are shown in a particular order for ease of description. However, one or more of the processes may be performed in a different order or may not be performed at all (and thus be optional), in accordance with some embodiments. Numerous variations on method 300 and the techniques described herein will be apparent in light of this disclosure.

Example System

Figure 5:
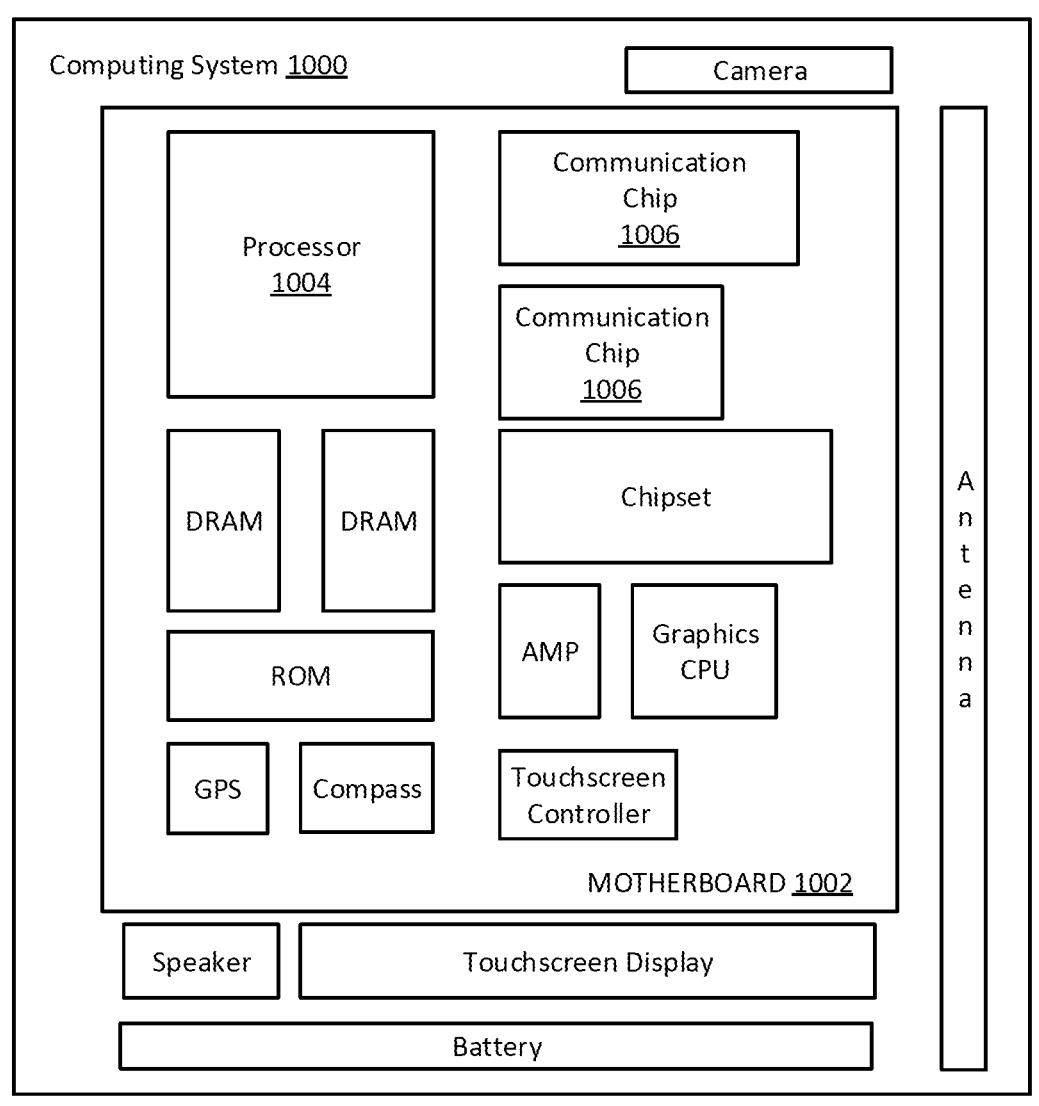
FIG. 5 illustrates a computing system implemented with integrated circuit structures (such as the integrated circuit structures illustrated in FIGS. 1A-1H) formed using the techniques disclosed herein, in accordance with some embodiments of the present disclosure.

FIG. 5 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip

1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1

An integrated circuit comprising: a first device including a first source or drain region; a second device including a second source or drain region; a conductive source or drain contact having (i) a lower portion in contact with the first source or drain region, and extending above the first source or drain region, and (ii) an upper portion extending laterally from above the lower portion to above the second source or drain region; and dielectric material between at least a section of the upper portion and the second source or drain region.

Example 2

The integrated circuit of example 1, wherein an interface is between the upper portion and the lower portion of the source or drain contact.

Example 3

The integrated circuit of example 2, wherein the interface includes a seam or a grain boundary or an intervening layer of conductive material.

Example 4

The integrated circuit of any one of examples 1-3, wherein the lower portion comprises: a conductive fill material comprising a metal; and a conductive liner, barrier, or encapsulation layer that is between the conductive fill material of the lower portion and the upper portion.

Example 5

The integrated circuit of any one of examples 1-4, wherein the upper portion has (i) a first section that is above and in contact with the lower portion and (ii) a second section that is above and not in contact with the second source or drain region.

Example 6

The integrated circuit of example 5, wherein the second section of the upper portion is separated from the second source or drain region by the dielectric material.

Example 7

The integrated circuit of any one of examples 5-6, wherein the upper portion further has a third section that is laterally between the first and second sections, wherein the third section is neither above the lower portion, nor above the second source or drain region.

Example 8

The integrated circuit of example 7, wherein the dielectric material is below the second section and below at least a part of the third section.

Example 9

The integrated circuit of any one of examples 1-8, further comprising: a conductive interconnect feature in contact with and extending from above the upper portion of the source or drain contact.

Example 10

The integrated circuit of example 9, wherein the conductive interconnect feature is a conductive via.

Example 11

The integrated circuit of any one of examples 9-10, wherein the conductive interconnect feature is a first conductive interconnect feature, and wherein the integrated circuit further comprises: a second conductive interconnect feature that is in contact with and extending from above the first interconnect feature, wherein the second conductive interconnect feature is a conductive line.

Example 12

The integrated circuit of any one of examples 1-11, wherein: the first device further comprises (i) a third source or drain region, (ii) a body comprising semiconductor material extending laterally from the first source or drain region to the third source or drain region, and (iii) a gate structure on the body.

Example 13

The integrated circuit of example 12, wherein the source or drain contact is a first source or drain contact, the lower portion is a first lower portion, and the upper portion is a first upper portion, and wherein the integrated circuit further comprises: a second source drain contact having (i) a second lower portion in contact with the third source or drain region, and extending above the third source or drain region, and (ii) a second upper portion extending above the second lower portion; wherein the first upper portion has a first dimension, and the second upper portion has a second dimension, the first and second dimensions are measured in a direction that is parallel to a length of the gate structure; and wherein the first dimension is at least 20% greater than the second dimension.

Example 14

The integrated circuit of example 13, wherein the second upper portion does not extend above any source or drain region, other than the third source or drain region.

Example 15

The integrated circuit of any one of examples 12-14, wherein the body is a nanoribbon, a nanowire, a nanosheet, or a fin.

Example 16

A printed circuit board comprising the integrated circuit of any one of examples 1-15.

Example 17

An integrated circuit comprising: a device comprising (i) a first source or drain region, (ii) a second source or drain region, (iii) a body comprising semiconductor material extending laterally from the first source or drain region to the second source or drain region, and (iv) a gate structure on the body; a first conductive source or drain contact having (i) a first lower portion extending from above the first source or drain region, and (ii) a first upper portion extending from above the first lower portion; and a second conductive source or drain contact having (i) a second lower portion extending from above the second source or drain region, and (ii) a second upper portion extending from above the second lower portion; wherein the first upper portion has a first dimension, and the second upper portion has a second dimension, the first and second dimensions are measured in a direction that is parallel to a length of the gate structure; and wherein the first dimension is at least 20% greater than the second dimension.

Example 18

The integrated circuit of example 17, wherein the device is a first device, the body is a first body, the gate structure is a first gate structure, and wherein the integrated circuit further comprises: a second device comprising (i) a third source or drain region, (ii) a fourth source or drain region, (iii) a second body comprising semiconductor material extending laterally from the third source or drain region to the fourth source or drain region, and (iv) a second gate structure on the second body; wherein the third source or drain region is laterally adjacent to the first source or drain region, and the fourth source or drain region is laterally adjacent to the second source or drain region; wherein the first upper portion of the first source or drain contact extends from above the first lower portion to above the third source or drain region; and wherein the second upper portion of the second source or drain contact does not extend from above the second lower portion to above the fourth source or drain region.

Example 19

The integrated circuit of example 18, further comprising: a dielectric material structure between and separating the first upper portion of the first source or drain contact and the third source or drain region.

Example 20

The integrated circuit of any one of examples 17-19, wherein the body is a nanoribbon, a nanowire, a nanosheet, or a fin.

Example 21

An integrated circuit comprising: a first device including a first source or drain region; a second device including a second source or drain region; and a conductive source or drain contact that is in contact with the first source or drain region, and includes an upper portion that extends laterally from above the first source or drain region to above or otherwise towards the second source or drain region, wherein an end of the upper portion of the conductive source or drain contact is closer to the second source or drain region than it is to the first source or drain region but not in contact with the second source or drain region.

Example 22

The integrated circuit of example 21, further comprising: dielectric material between, and to isolate, the conductive source or drain contact and the second source or drain region.

Example 23

The integrated circuit of any one of examples 21-22, wherein: the conductive source or drain contact further includes a lower portion that is between another end of the upper portion and the first source or drain region; the upper portion comprises a first monolithic body of conductive material; and the lower portion comprises a second monolithic body of conductive material, with an interface between the first and second monolithic bodies of conductive material.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit comprising:
a first device including a first source or drain region, a semiconductor body extending from the first source or drain region along a first direction, and a gate structure extending along a second direction and around the semiconductor body;
a second device including a second source or drain region;
a conductive source or drain contact having (i) a lower portion in contact with the first source or drain region, and extending above the first source or drain region, and (ii) an upper portion extending laterally along the second direction from above the lower portion to above the second source or drain region;

a dielectric gate spacer between the gate structure and the conductive source or drain contact along the first direction; and
dielectric material between at least a section of the upper portion and the second source or drain region,
wherein a top surface of the upper portion is coplanar with a top surface of the dielectric gate spacer.

2. The integrated circuit of claim 1, wherein an interface is between the upper portion and the lower portion of the source or drain contact.

3. The integrated circuit of claim 2, wherein the interface includes a seam or a grain boundary or an intervening layer of conductive material.

4. The integrated circuit of claim 1, wherein the lower portion comprises:
a conductive fill material comprising a metal; and
a conductive liner, barrier, or encapsulation layer that is between the conductive fill material of the lower portion and the upper portion.

5. The integrated circuit of claim 1, wherein the upper portion has (i) a first section that is above and in contact with the lower portion and (ii) a second section that is above and not in contact with the second source or drain region.

6. The integrated circuit of claim 5, wherein the second section of the upper portion is separated from the second source or drain region by the dielectric material.

7. The integrated circuit of claim 5, wherein the upper portion further has a third section that is laterally between the first and second sections, wherein the third section is neither above the lower portion, nor above the second source or drain region.

8. The integrated circuit of claim 7, wherein the dielectric material is below the second section and below at least a part of the third section.

9. The integrated circuit of claim 1, further comprising:
a conductive interconnect feature in contact with and extending from above the upper portion of the source or drain contact, wherein the conductive interconnect feature is a conductive via.

10. The integrated circuit of claim 9, wherein the conductive interconnect feature is a first conductive interconnect feature, and wherein the integrated circuit further comprises:
a second conductive interconnect feature that is in contact with and extending from above the first interconnect feature, wherein the second conductive interconnect feature is a conductive line.

11. The integrated circuit of claim 1, wherein:
the first device further comprises a third source or drain region, and the semiconductor body extends laterally from the first source or drain region to the third source or drain region.

12. The integrated circuit of claim 11, wherein the source or drain contact is a first source or drain contact, the lower portion is a first lower portion, and the upper portion is a first upper portion, and wherein the integrated circuit further comprises:
a second source drain contact having (i) a second lower portion in contact with the third source or drain region, and extending above the third source or drain region, and (ii) a second upper portion extending above the second lower portion;
wherein the first upper portion has a first dimension along the second direction, and the second upper portion has a second dimension along the second direction; and
wherein the first dimension is at least 20% greater than the second dimension.

13. The integrated circuit of claim 12, wherein the second upper portion does not extend above any source or drain region, other than the third source or drain region.

14. The integrated circuit of claim 11, wherein the body is a nanoribbon, a nanowire, a nanosheet, or a fin.

15. A printed circuit board comprising the integrated circuit of claim 1.

16. An integrated circuit comprising:

a device comprising (i) a first source or drain region, (ii) a second source or drain region, (iii) a body comprising semiconductor material extending laterally from the first source or drain region to the second source or drain region, and (iv) a gate structure on the body;

a first conductive source or drain contact having (i) a first lower portion extending from above the first source or drain region, and (ii) a first upper portion extending from above the first lower portion; and a second conductive source or drain contact having (i) a second lower portion extending from above the second source or drain region, and (ii) a second upper portion extending from above the second lower portion;

wherein the first upper portion has a first dimension, and the second upper portion has a second dimension, the first and second dimensions are measured in a direction that is parallel to a length of the gate structure; and wherein the first dimension is at least 20% greater than the second dimension.

17. The integrated circuit of claim 16, wherein the device is a first device, the body is a first body, the gate structure is a first gate structure, and wherein the integrated circuit further comprises:

a second device comprising (i) a third source or drain region, (ii) a fourth source or drain region, (iii) a second body comprising semiconductor material extending laterally from the third source or drain region to the fourth source or drain region, and (iv) a second gate structure on the second body;

wherein the third source or drain region is laterally adjacent to the first source or drain region, and the fourth source or drain region is laterally adjacent to the second source or drain region;

wherein the first upper portion of the first source or drain contact extends from above the first lower portion to above the third source or drain region; and wherein the second upper portion of the second source or drain contact does not extend from above the second lower portion to above the fourth source or drain region.

18. The integrated circuit of claim 17, further comprising:

a dielectric material structure between and separating the first upper portion of the first source or drain contact and the third source or drain region.

19. An integrated circuit comprising:

a first device including a first source or drain region, a semiconductor body extending from the first source or drain region along a first direction, and a gate structure extending along a second direction and around the semiconductor body;

a second device including a second source or drain region;

a conductive source or drain contact that is in contact with the first source or drain region, and includes an upper portion that extends laterally from above the first source or drain region towards the second source or drain region without passing over the second source or drain region, wherein a first plane coplanar with an end of the upper portion of the conductive source or drain contact is laterally separated from a second plane coplanar with an edge of the second source or drain region by at most 4 nanometers; and a dielectric gate spacer between the gate structure and the conductive source or drain contact along the first direction, wherein a top surface of the upper portion is coplanar with a top surface of the dielectric gate spacer.

20. The integrated circuit of claim 19, further comprising: dielectric material between, and to isolate, the conductive source or drain contact and the second source or drain region.

21. The integrated circuit of claim 19, wherein:

the conductive source or drain contact further includes a lower portion that is between another end of the upper portion and the first source or drain region;

the upper portion comprises a first monolithic body of conductive material; and the lower portion comprises a second monolithic body of conductive material, with an interface between the first and second monolithic bodies of conductive material.

\*   \*   \*   \*   \*